United States Patent
Li et al.

(10) Patent No.: US 11,081,358 B2
(45) Date of Patent: Aug. 3, 2021

(54) SILICIDE FILM NUCLEATION

(71) Applicant: Applied Materials, Inc., Santa Clara, CA (US)

(72) Inventors: Xuebin Li, Sunnyvale, CA (US); Errol Antonio C. Sanchez, Tracy, CA (US); Patricia M. Liu, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/400,260

(22) Filed: May 1, 2019

(65) Prior Publication Data

US 2020/0013624 A1    Jan. 9, 2020

Related U.S. Application Data

(60) Provisional application No. 62/694,294, filed on Jul. 5, 2018.

(51) Int. Cl.
| | | |
|---|---|---|
| *H01L 21/285* | (2006.01) | |
| *H01L 21/67* | (2006.01) | |
| *H01L 21/677* | (2006.01) | |
| *H01L 21/768* | (2006.01) | |

(52) U.S. Cl.
CPC .. *H01L 21/28518* (2013.01); *H01L 21/67213* (2013.01); *H01L 21/67739* (2013.01); *H01L 21/76876* (2013.01)

(58) Field of Classification Search
CPC ......... H01L 21/28518; H01L 21/67213; H01L 21/67739; H01L 21/76876; H01L 21/823814; H01L 21/28525; H01L 21/67207; H01L 21/67167
See application file for complete search history.

(56) References Cited

U.S. PATENT DOCUMENTS

| | | | |
|---|---|---|---|
| 6,208,751 B1 | 3/2001 | Almogy | |
| 7,431,795 B2 | 10/2008 | Kumar et al. | |
| 8,550,031 B2 | 10/2013 | Ishikawa et al. | |
| 9,923,081 B1 | 3/2018 | Bao et al. | |
| 9,966,438 B2 | 5/2018 | Huang et al. | |
| 10,276,688 B2 | 4/2019 | Bao et al. | |
| 2015/0044842 A1* | 2/2015 | Wang | ............... H01L 29/6659 438/296 |
| 2018/0230624 A1 | 8/2018 | Dube et al. | |
| 2018/0277483 A1* | 9/2018 | Gluschenkov | ........ H01L 23/535 |

* cited by examiner

*Primary Examiner* — Kyoung Lee
*Assistant Examiner* — Christina A Sylvia
(74) *Attorney, Agent, or Firm* — Patterson + Sheridan, LLP

(57) ABSTRACT

Embodiments disclosed herein are directed to forming MOSFET devices. In particular, one or more pre-silicide treatments are performed on a substrate prior to the deposition of the metal-silicide layer to improve the density and performance of the metal-silicide layer in the MOSFETs. The metal-silicide formation formed with the pre-silicide treatment(s) can occur before or after the formation of metal gates during MOSFET fabrication.

13 Claims, 7 Drawing Sheets

SILICIDE FILM NUCLEATION

PRIORITY CLAIM

The present disclosure claims the benefit of U.S. Provisional Application 62/694,294, "Silicide Film Nucleation," filed Jul. 5, 2018, incorporated by reference in its entirety herein.

BACKGROUND

Field

Embodiments of the present disclosure generally relate to the fabrication of field-effect transistors (FETs) and forming silicides on substrates for FETs.

Description of the Related Art

Metal-silicides and polycrystalline metal-silicides can be formed on various substrates used for semiconductor and electronics manufacture, including the manufacture of FETs and specifically metal-oxide semiconductor FETs (MOSFETs). The nucleation of silicides during the silicide formation process can be negatively impacted by upstream fabrication operations due to the multi-step fabrication processes used for FET and MOSFET.

Field effect transistors (FET) are a family of transistors that rely on an electric field created by the voltage on the gate in order to control the current flow between the drain and the source. One of the many types of FETs is the MOSFET. The metal-oxide semiconductor is used as an insulating layer between the gate and the substrate of the transistor. The fabrication of MOSFET devices includes multiple deposition and patterning operations that are executed to form and electrically connect and/or isolate various features of the device. At least one silicide layer is typically formed during the MOSET fabrication process. Nucleation of the silicide layer, which can be a metal-silicide including a polycrystalline ("poly") metal-silicide, can be challenging in light of the numerous process operations involved in MOSFET fabrication. These fabrication operations can inhibit metal-silicide nucleation by reducing the number of nucleation sites for the metal-silicide formation and/or increase the activation energy necessary to nucleate the metal-silicide formation.

Thus, there remains a need in the art for an improved method of MOSFET fabrication.

SUMMARY

The systems and methods discussed herein are directed towards the fabrication of MOSFET devices. In one example, a system for fabricating a MOSFET device includes a transfer chamber defining a transfer space; a plurality of process chambers, wherein each process chamber of the plurality of process chambers is coupled to the transfer chamber; and a transfer robot in the transfer space configured to access the transfer chamber and the plurality of process chambers. The system further includes a controller comprising instructions for device fabrication, wherein, when executed by a processor, the instructions: retrieve a substrate from the transfer chamber; dispose the substrate in a first process chamber of the plurality of process chambers; perform at least one pre-silicide treatment on the substrate in the first process chamber to increase a concentration of a dopant within the substrate or to increase a surface roughness of the substrate; and subsequently, form, by deposition, in a second process chamber of the plurality of process chambers, a metal-silicide on the substrate.

In an example method of forming a metal-silicide, the method includes: forming a seed layer on a substrate, wherein the seed layer comprises a doped silicon layer from 1 nm to 5 nm thick; and subsequently, forming, by CVD deposition, a metal-silicide layer on the seed layer.

In another example method of forming a metal-silicide, the method includes: performing a pre-silicide treatment on a substrate, wherein the pre-silicide treatment comprises one or more of: forming a seed layer, wherein the seed layer is from 1 nm to 5 nm thick and comprises a dopant concentration from $1E^{19}$ to $1E^{23}$; exposing the substrate to one or more precursor sources to form a doped surface of the substrate; implanting a dopant in the substrate; and etching a surface of the substrate. The method further includes, subsequent to performing the pre-silicide treatment on the substrate, forming a metal-silicide layer on the treated substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The systems and methods discussed herein improve the MOSFET fabrication process at least in part by promoting nucleation of the silicide layer using one or more pre-silicide treatments prior to the formation of the metal-silicide on the substrate. Exemplary pre-silicide treatments include: 1. deposition of a thin, highly doped Si seed layer (such as SiP, SiAs, or SiB) before $TiSi_x$ formation; 2. deposition of a thin SiGe seed layer or passivation of the substrate surface using a Ge-precursor to nucleate the metal-silicide; 3. pre-soaking the substrate in dopant gas ($PH_3$, $AsH_3$, $B_2H_6$, or other dopants) before $TiSi_x$ formation; 4. silicon or surface pre-treatment by implantation for dopant injection; 5. surface pre-treatment by physical sputtering (e.g., etching) to amorphize the surface.

In various embodiments, the pre-silicide treatments can include (1) a first pre-silicide treatment for NMOS devices that includes forming a highly doped Si seed layer (such SiP, SiAs, SiB) before forming the metal-silicide, discussed herein using the example metal-silicide $TiSi_x$ or $TiSi_2$; (2) a second pre-silicide treatment for PMOS devices that includes forming a SiGe seed layer, a GeB seed layer, or a SiGe-B seed layer for a PMOS device either by using an Si source such as dichlorosilane (DCS), silane ($SiH_4$), disilane (DS), and/or a Ge source such as germane ($GeH_4$), digermane ($Ge_2H_6$), germanium chloride ($GeCl_4$), or by passivating an Si substrate in a Ge-precursor; (3) a third pre-silicide treatment for various MOSFET device types that includes forming a dopant-passivated surface of the substrate by pre-soaking the substrate in a dopant precursor gas such as phosphine ($PH_3$), arsine ($AsH_3$), diborane ($B_2H_6$), or other dopant gases; (4) a fourth pre-silicide treatment for various MOSFET device types that includes increasing the dopant content of the substrate and the surface roughness by injecting a dopant into the Si substrate prior to forming the metal-silicide; and/or (5) a fifth pre-silicide treatment for various MOSFET device types that includes performing a surface pre-silicide treatment of the substrate by physical sputtering to increase the roughness of the surface, which increases the surface area of the substrate surface, thus increasing the nucleation sites for the metal-silicide. As discussed herein, "physical sputtering" refers to bombardment of the substrate (source/drain) to remove atoms from the surface to increase the surface roughness. Physical sputtering may also include redeposition of the removed atoms onto the substrate surface. The pre-silicide treatments (1)-(5) can be performed alone or in any combination prior to metal-silicide formation, as discussed in detail below. The NMOS and PMOS chambers discussed herein are source/drain epitaxy chambers configured to deposit various compositions of source and drain elements during fabrication.

Figure 1:
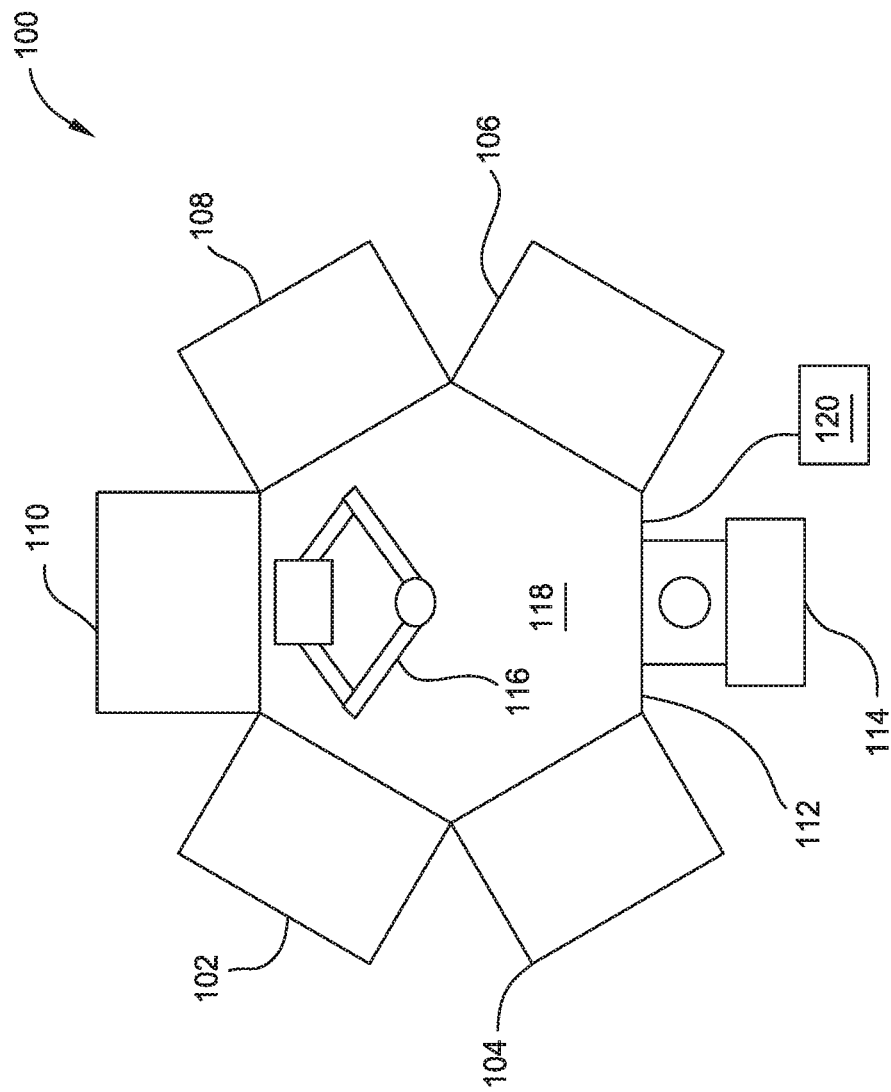
FIG. 1 is a schematic illustration of a system for forming semiconductor components according to embodiments of the present disclosure.

FIG. 1 is a schematic plan view of a system 100 for forming MOSFET devices according to embodiments of the present disclosure. The system 100 is a cluster tool that includes a first chamber 102, a second chamber 104, a third chamber 106, a fourth chamber 108, a fifth chamber 110, and a central transfer chamber 112 that defines a transfer space 118 that contains a central transfer robot 116. The system 100 further includes a controller 120 coupled to the system 100. The controller is programmed to execute a plurality of instructions for the operation of the system 100 to fabricate MOSFET devices, including operation of the central transfer robot 116 as well as operation of the chambers 102-110 and a loading chamber 114. The central transfer robot 116 is configured to transfer substrates between the loading chamber 114 and the one or more chambers 102-110 through the transfer space 118.

While not shown in FIG. 1, chambers 102, 104, 106, 108, and/or 110 of the system 100 can further include one or more remote plasma sources, and on or more gas sources for precursor gases, carrier gases, and other process gases. The system 100 can also include a plurality of components such as sensors and controls configured to control pressure, temperature, gas flow, and gas composition in some or all of the chambers 102-110. The system 100 can thus be configured to form desired structures and devices, including MOSFET devices such as NMOS and PMOS devices. In one example, one or more of the chambers 102-110 is held under vacuum pressure, and the substrates moved therebetween are not exposed to ambient air. In an embodiment, MOSFET devices are fabricated using the system 100 in a plurality of operations. The substrate can be moved among and between one or more chambers 102-110. In one embodiment, the first chamber 102 is thus used for silicide operations, and, in some embodiments, for one or more pre-silicide treatments. In one example, when the first chamber 102 is a metal-silicide formation chamber, the substrates are transferred through the transfer space 118 and are not exposed to ambient air during transfer to/from the first chamber 102. In some embodiments, the first chamber 102 is used for silicide operations including metal-silicide formation using, for example, a CVD process. In other embodiments, the first chamber can additionally be used to perform the pre-silicide treatments discussed herein prior to metal-silicide formation in addition to metal-silicide formation.

In an embodiment, the first chamber 102 is a metal-silicide deposition chamber that can be, in one example, a chemical vapor deposition (CVD) chamber. The second chamber 104 is an NMOS chamber, such as that used for source-drain epitaxy (e.g., an epitaxial deposition chamber), and may be coupled to one or more precursor sources of Si, P, and/or As for NMOS formation. The third chamber 106 is a PMOS chamber, such as that used for source-drain epitaxy, and may be coupled to one or precursor sources of Si, Ge, and/or B for PMOS formation. The fourth chamber 108 is a plasma chamber to which sources of dopants, as well as sources of Ar and He gas, may be introduced to facilitate plasma ignition in the fourth chamber. The plasma chamber can be used for various MOSFET fabrication operations, including etching operations.

In one example, PMOS devices can be fabricated in chambers of the system 100 including the third chamber 106, and NMOS devices can be fabricated in chambers including the second chamber 104. Both NMOS and PMOS devices, as well as other types of MOSFET devices, can be fabricated using either the third chamber 106 or the second chamber 104 in addition to one or more of the first chamber 102 when configured as a metal-silicide formation chamber, the fourth chamber 108 when configured as a plasma chamber, or the fifth chamber 110 when configured as a pre-clean chamber. That is, various combinations of the chambers 102-108 can be used to fabricate NMOS or PMOS devices depending upon the embodiment. The pre-clean chamber can be used to remove oxides from the substrate surface prior to or during operations in the MOSFET device fabrication process.

The metal-silicide formation operation discussed herein, which includes one or more pre-silicide treatments and the formation of the metal-silicide, can be performed in the first chamber 102 when the first chamber 102 is configured as a metal-silicide deposition chamber. The process can alternatively be performed in a metal-silicide deposition chamber, after the one or more pre-silicide treatments is performed, in the second chamber 104 (when the second chamber 104 is configured as an NMOS chamber), the third chamber 106 (when the third chamber 106 is configured as a PMOS chamber), and/or in the fourth chamber 108 (when the fourth chamber 108 is configured as a plasma chamber). The use of the chambers 102-110 in the system 100 are discussed in detail below.

Figure 2:
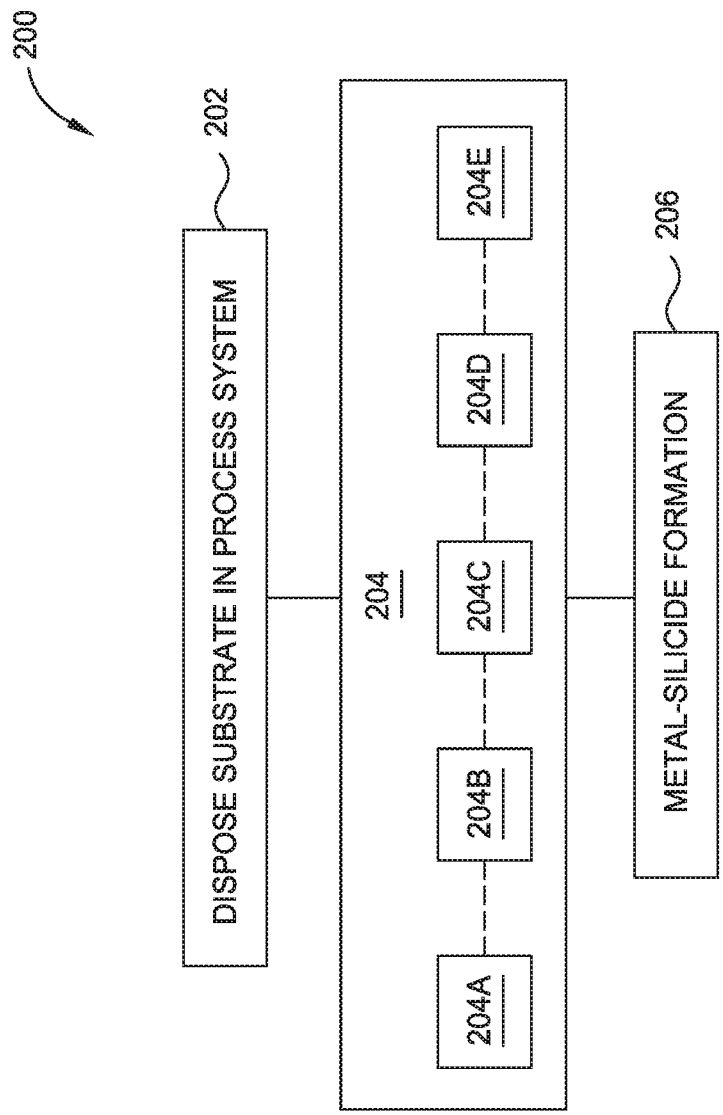
FIG. 2 is a flow chart of a method of forming a metal-silicide on a substrate according to embodiments of the present disclosure.

FIG. 2 is a flow chart of a method 200 of forming a metal-silicide on a substrate according to embodiments of the present disclosure. The formation of a metal-silicide on a substrate, as discussed herein, can occur at various points in a manufacturing process for a MOSFET device. At operation 202, a substrate is disposed in a processing apparatus such as the loading chamber 114 of the system 100 in FIG. 1. In this example, a substrate can be transferred from the loading chamber 114 into the transfer space 118 and or a factory interface or other front end robot (not shown), and, subsequently transferred into one or more chambers as discussed in FIG. 1. In some examples, a pre-clean operation occurs as a part of operation 202, for example, in a pre-clean chamber such as the fifth chamber 110 as discussed in FIG. 1. In various examples, pre-cleaning can involve removing oxides from a substrate surface, de-gassing, or other operations, depending upon the substrate received and the type of device being fabricated.

At operation 204 of the method 200, one or more pre-silicide treatments occur. The pre-silicide treatment at operation 204 improves the nucleation of the metal-silicide layer formed at operation 206, discussed below, by decreasing the activation energy barrier for nucleation of the layer and/or by providing additional nucleation sites. The pre-silicide treatment at operation 204 can occur in one or more chambers 102-108 of the system 100, depending upon the embodiment and/or the type of MOSFET device being fabricated. The improved nucleation of the metal-silicide layer after one or more pre-silicide treatments can be in response to one or more of increasing a dopant concentration of the substrate (as the dopant atoms on the surface of the substrate can act as nucleation sites), or increasing a surface roughness (amorphizing the surface) of the substrate to provide more nucleation sites for nucleation of the metal-silicide layer.

In an embodiment, the pre-silicide treatment at operation 204 includes one or more pre-silicide treatments that can be performed as one or more sub-operations 204A-204E. Stated otherwise, one or more of sub-operations 204A-204E, in any order, may be formed as the pre-silicide treatment at operation 204. In an example of the first pre-silicide treatment during first sub-operation 204A, a highly doped seed layer is formed on the substrate (e.g., on the source and the drain). The highly doped seed layer is formed to a thickness from about 1 nanometer (nm) to about 5 nm and a dopant concentration from $1E^{19}$ to $1E^{23}$. As used herein, "dopant concentration" has SI units of atom/cm$^3$. Example dopants used to form the seed layer in the first sub-operation 204A can be P, As, and/or B. The first sub-operation 204A can be employed during the fabrication of NMOS devices. The first sub-operation 204A can therefore be performed in an NMOS chamber such as the second chamber 104 of FIG. 1 using chemical vapor deposition (CVD), or in a metal-silicide deposition chamber such as the first chamber 102.

In an example of the first pre-silicide treatment, a thin, highly doped Si seed layer is formed on an NMOS substrate (e.g., on the source and the drain). The seed layer can be formed to a thickness from about 1 nm to about 5 nm and at a dopant concentration of at least $1 \times E^{19}$. In an embodiment, the seed layer comprises a dopant level from $1 \times E^{19}$ to $1 \times E^{23}$. Dopants used in the first pre-silicide treatment can be n-type dopants such as P or As. The highly doped seed layer reduces the activation energy barrier for the metal-silicide, promoting nucleation of the metal-silicide layer by providing additional nucleation sites in the form of dopant atoms. The activation energy barrier is an amount of energy needed for a reaction, such as the nucleation of metal-silicide. The lower the activation energy barrier is for a reaction, the lower the energy needed to initiate that reaction, and a lower activation energy can be desirable since it can mean that less of the substrate is consumed during the reaction, and/or that a more uniform layer with increased thermal stability is formed.

In an example of the second pre-silicide treatment at second sub-operation 204B, a thin, highly doped seed layer is formed on a substrate of a PMOS device in the PMOS chamber, such as the third chamber 106 of the system 100. The seed layer can be formed to a thickness from about 1 nm to about 5 nm and a dopant concentration from $5E^{29}$ to $1E^{23}$. In one example of the second sub-operation 204B, a thin, highly doped seed layer of SiGe or GeB or SiGe-B is formed in the PMOS chamber.

In an example of the second pre-silicide treatment, a thin, highly-doped seed layer is formed on a PMOS substrate using one or more Ge-containing and/or B-containing precursors. The activation energy of nucleation of a subsequently-formed metal-silicide is reduced by reducing the surface energy of the substrate deposition surface. The surface energy of the substrate deposition surface is reduced by increasing the dopant concentration at the deposition surface via inclusion of the highly-doped seed layer. In one example of the second pre-silicide treatment, a seed layer of SiGe or GeB or SiGe-B is formed. The dopants such as B aid in reducing the contact resistance between the metal-silicide layer and the substrate, and provide additional nucleation sites for the metal-silicide layer. In another example of the second pre-silicide treatment, the Si substrate is soaked in a Ge-containing precursor to passivate the surface to have a dopant concentration of $5 \times E^{20}$ or greater. In this example, a SiGe seed layer is formed by exposing a Si substrate to GeH$_4$ and HCl, and a Ge residue is formed on the Si substrate.

In an example of the third pre-silicide treatment at third sub-operation 204C, which can be used to form PMOS or NMOS devices, a CVD process is used to expose and to soak the substrate in a dopant gas such as PH$_3$, AsH$_3$, B$_2$H$_6$, or other precursors including dopants capable of passivating the substrate surface. The third sub-operation 204C can be performed in the NMOS chamber (such as the second chamber 104), the PMOS chamber (such as the third chamber 106), or the plasma chamber (such as the fourth chamber 108). In one example, the third sub-operation 204C is performed at a temperature from 100° C. to 600° C., or from 200° C. to 500° C., or at about 450° C. Sub-operation 204C is performed from 30 seconds to 20 minutes, from 1 minute to 5 minutes, or for about 2 minutes, depending upon the embodiment. During the third sub-operation 204C, the process chamber in which the substrate is disposed is maintained at a pressure from about 5 Torr to about 1 atmosphere (atm). The soaking enhances a nucleation site density as compared to an untreated substrate surface since dopant atoms on the substrate surface act as nucleation sites for the metal-silicide layer.

In an example of the fourth pre-silicide treatment at fourth sub-operation 204D, a dopant implantation is performed via ion implantation on a substrate for either an NMOS or a PMOS device. Dopants such as B, As, and/or P can be implanted in the substrate at the fourth sub-operation 204D to produce a dopant concentration of $1 \times E^{19}$ to $1 \times E^{23}$. The fourth sub-operation 204D can be performed in various chambers of a cluster tool, depending upon the type of device being fabricated. In an example of the fourth pre-silicide treatment, the substrate surface is doped via ion implantation to increase a dopant level of the substrate surface and/or to increase a surface roughness of the substrate surface. In addition to increasing the dopant level of the substrate, the fourth pre-silicide treatment increases a surface roughness (and a surface area of the substrate surface at the roughed area) which promotes nucleation of the metal-silicide layer by providing more nucleation sites.

In an example of the fifth pre-silicide treatment at fifth sub-operation 204E, a pre-silicide treatment including a substrate surface treatment is performed to increase a dopant level of the substrate surface and increase surface roughness by the physical sputtering (e.g., etching) of the substrate surface. The etching at sub-operation 204E can be performed using an etching process in the plasma chamber such as the fourth chamber 108 in FIG. 1, or in other chambers of the cluster tool that are appropriately configured. The etching may occur by physically accelerating one or more dopants towards the substrate surface to both simultaneously etch and dope the substrate.

In one example, the pre-silicide treatment at operation 204 includes one or more of the sub-operations 204A-204E. When two or more sub-operations 204A-204E is performed at operation 204, each sub-operation can be performed in series, and, in some examples, two or more sub-operations can be performed simultaneously. In one example, two or more sub-operations 204A-204E are performed at operation 204, and the two or more sub-operations can be performed in a single chamber (102-108) of the system 100 discussed above. In another example, when two or more sub-operations 204A-204E are performed at operation 204, the two or more sub-operations can be performed in two or more chambers (102-108) of the system 100 discussed above. In some examples, sub-operations 204A-204C can occur in the metal-silicide deposition chamber, such as the first chamber 102, of the system 100 if the precursor sources employed for the one or more sub-operations are provided to the metal-silicide deposition chamber. In one example, sub-operations 204A-204C can occur in an NMOS chamber or a PMOS chamber where source-drain epitaxy is performed. In this example, one or more of the sub-operations 204A-204C can occur as a part of the source-drain deposition process or in a separate, subsequent operation within the NMOS chamber or PMOS chamber. Subsequent to formation of the source and the drain and the at least one pre-silicide treatment, the substrate can be subsequently transferred to a metal-silicide deposition chamber for operation 206 discussed below.

Subsequent to performing one or more sub-operations 204A-204E at operation 204, at operation 206, a metal-silicide or a poly metal-silicide is formed on the substrate via CVD deposition. The nucleation of the metal-silicide at operation 206 is aided by the one or more pre-silicide treatments at operation 204, which lower the activation energy barrier for nucleation and/or increase the amount of nucleation sites for the metal-silicide. In an embodiment, if a highly doped seed layer is formed via one or more of the first or the second sub-operations 204A or 204B, the highly doped seed layer can be partially (less than 100%) or fully (100%) consumed during the metal-silicide formation during CVD deposition at operation 206. In one example, 50%-90% of the thickness of the seed layer is consumed during nucleation. In one example, the seed layer formed at the first sub-operation 204A or the second sub-operation 204B includes up to about 5% of the mass of each of the source and the drain after metal-silicide formation during CVD deposition at operation 206.

In an embodiment, operation 206 is performed, for example, in a metal-silicide deposition chamber that may be similar to the first chamber 102 of the system 100. The CVD deposition at operation 206 is fully selective when performed within specific process conditions. That is, the metal-silicide is formed at operation 206 only on the exposed areas of the substrate, such as the source and the drain, and is not formed elsewhere on areas covered with dielectric material. Thus, there is no need for a subsequent etchback operation or other removal operation of any unwanted metal-silicide.

In an embodiment, during operation 206 the CVD deposition of the metal-silicide can consume some or all of the pre-silicide treatment. For example, consumption may occur if the first sub-operation 204A or the second sub-operation 204B are used to form a seed layer, or the second sub-operation 204B is used to form a passivated surface of the substrate. In an embodiment, operation 206 fully consumes the seed layer formed by one or more of sub-operations 204A or 204B. In another embodiment, a mass of the seed layer formed by one or more of the first or the second sub-operations 204A or 204B remains after operation 206. In one example, 10% of a mass of the seed layer remains on the source/drain after operation 206, and, in another example, 5% or less of the mass of the seed layer remains on the source/drain after operation 206. The source and the drain discussed herein, where the metal-silicide layer is formed at operation 206, can be partially consumed during operation 206. In one example, a total volume of the source and the drain is reduced by less than 40% during formation of the metal-silicide. In one example, a total volume of the source and the drain is reduced by less than 30% during formation of the metal-silicide. In one example, a total volume of the source and the drain is reduced by less than 20% during formation of the metal-silicide. In another example, a total volume of the source and the drain is reduced by less than 10% during formation of the metal-silicide. In another example, a total volume of the source and the drain is reduced by less than 5% during formation of the metal-silicide.

In some embodiments, the pre-silicide treatment and metal-silicide formation on the source and the drain are performed in a MOSFET manufacturing process prior to dopant activation of the source and drain and prior to formation of the metal gate. In other embodiments, the pre-silicide treatment and subsequent metal-silicide formation on the source and the drain are performed subsequent to dopant activation, the formation of the metal gate, and the opening of a contact area, but prior to formation of the contact. These processes are referred to as early and late silicidation, respectively.

Figure 3A:
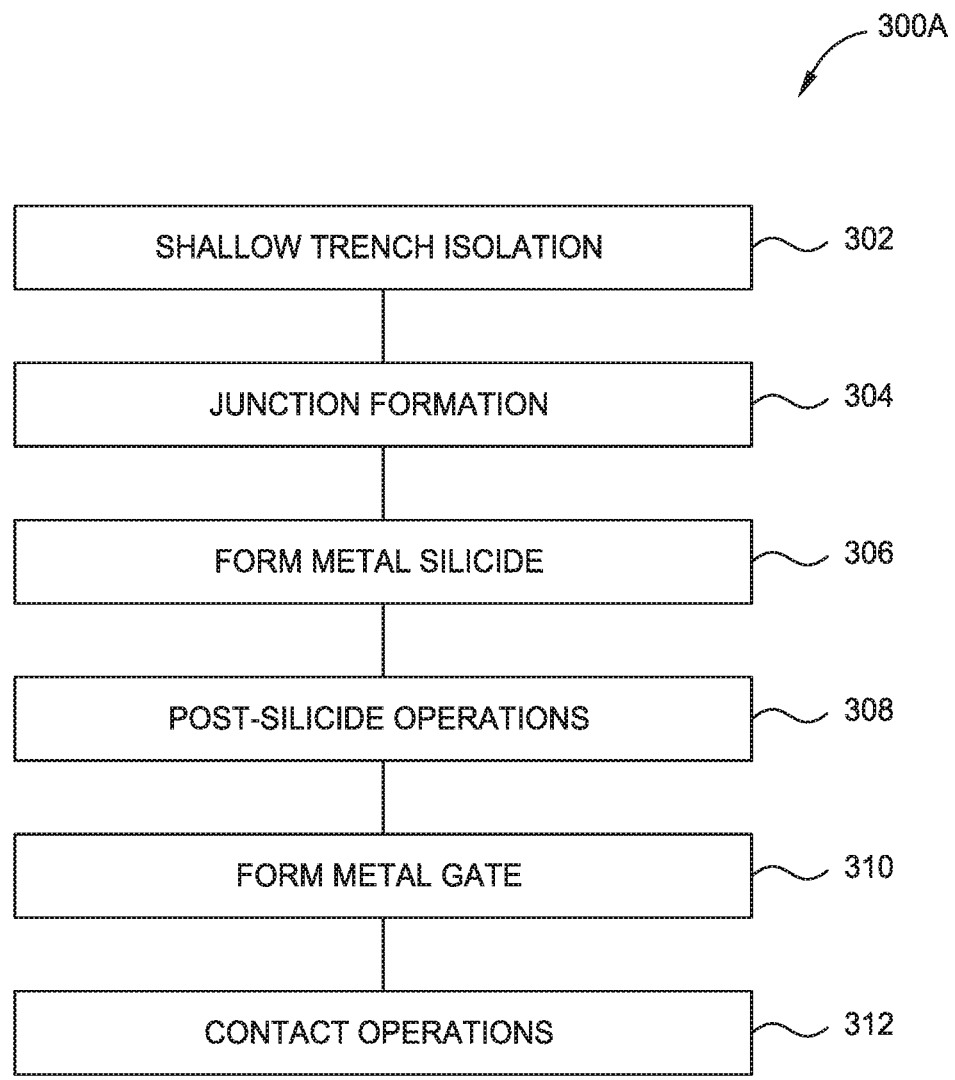
FIG. 3A is a flow chart of a method of forming a MOSFET device according to embodiments of the present disclosure.
Figure 3B:
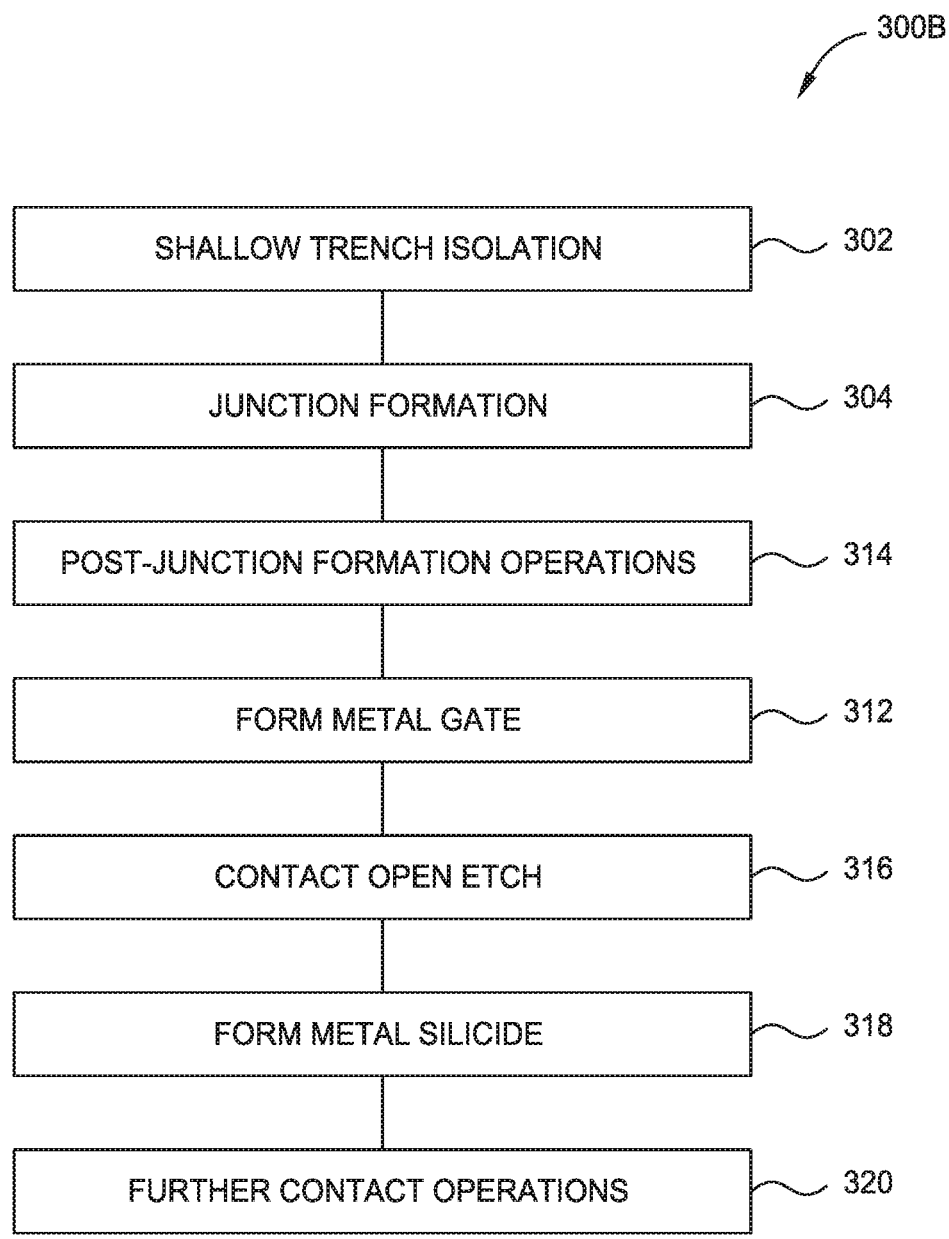
FIG. 3B is a flow chart of another method of forming a MOSFET device according to embodiments of the present disclosure.

FIG. 3A is a flow chart of a method 300A of forming a MOSFET device according to embodiments of the present disclosure. FIG. 3B is a flow chart of an alternate method 300B of forming a MOSFET device according to embodiments of the present disclosure. FIGS. 3A and 3B illustrate methods of forming MOSFET devices in which the metal-silicide formation occurs at different points in the method. In an embodiment of the method 300A at operation 302, a shallow trench isolation is performed that includes a plurality of sub-operations. In one example, operation 302 can be performed in a system other than system 100 in FIG. 1, and the substrate is subsequently transferred to the system 100. At operation 304 of the method 300A, subsequent to the shallow trench isolation at operation 302, a source and a drain of a MOSFET junction is formed. Operation 304 can be performed in the system 100 of FIG. 1. The source and drain are formed at operation 304 by epitaxial deposition in an NMOS source-drain epitaxy chamber or in a PMOS source-drain epitaxy chamber. In an embodiment, the operations 302 and 304 can be executed in a system 100 such as that illustrated in FIG. 1, in particular in chambers including a pre-clean chamber, a plasma chamber, a PMOS chamber and/or an NMOS chamber as discussed in the chambers 104-110 of the system 100.

In an embodiment of the method 300A, at operation 306, a metal-silicide is formed as discussed in the method 200. In one example, the operation 306 comprises performing a pre-silicide treatment including one or more sub-operations 204A-204E from the method 200 discussed above in FIG. 2 followed by the metal-silicide formation (operation 206 in the method 200). In another example, operation 306 includes one or more pre-silicide treatment sub-operations 204A-204O that can occur in an NMOS chamber or in a PMOS chamber during source/drain deposition prior to transferring the substrate to a metal-silicide deposition chamber. That is, one or more pre-silicide treatments can be performed during source-drain formation in the same chamber as the source-drain formation. Thus, operation 306 can occur in one or more chambers including the NMOS chamber and the metal-silicide deposition chamber, the PMOS chamber and the metal-silicide deposition chamber, or combinations of other chambers depending upon the embodiment. In the method 300A, the metal-silicide formation at operation 306 occurs prior to activation of the dopants of the source and drain at operation 308 in MOSFET components fabricated at operations 302 and 304. In an embodiment, the metal-silicide formed at operation 306 is stable up to about 900° C. Subsequent to metal-silicide formation at operation 306, at operation 308, a plurality of operations can occur including dopant activation, dielectric deposition, and annealing operations. At operation 310, the metal gates are deposited. Subsequent to the formation of the metal gates at operation 310, at operation 312, a plurality of operations can occur including a contact open etch, contact formation, and contact filling.

FIG. 3B shows method 300B, which comprises similar operations to the method 300A. However, in contrast to the method 300A, where the metal-silicide formation at operation 306 occurs prior to formation of the metal gates at operation 312, the metal-silicide formation in the method 300B occurs subsequent to metal gate formation. As shown in FIG. 3B, the shallow trench isolation occurs at operation 302, followed by the junction formation at operation 304, similarly to the method 300A. In contrast to the method 300A, and subsequent to junction formation at operation 304, at operation 314, a plurality of post-junction formation operations can occur. Post-junction formation operations include dopant activation, dielectric deposition, and annealing operations. Subsequently, at operation 312, the metal gate is formed and, at operation 316, a contact open etching operation is performed. Subsequent to operation 316, at operation 318, the metal-silicide is formed using one or more pre-silicide treatments and subsequent metal-silicide formation according to one or more methods 200 as discussed in FIG. 2. Subsequent to formation of the metal-silicide at operation 318, at operation 320, further operations including contact operations such as contact formation, annealing, and filling can occur.

In an embodiment of the methods 300A and 300B, the metal-silicide is selectively formed respectively at operation 306 and 318 via CVD deposition on the source and drain and is not formed in other, undesirable areas that are covered with dielectric material. Since the metal-silicide does not form on areas other than the source and the drain, there is no removal operation for the metal-silicide in the methods 300A and 300B. The formation of the metal-silicide during operations 306 and 318 is fully selective.

Figure 4A:
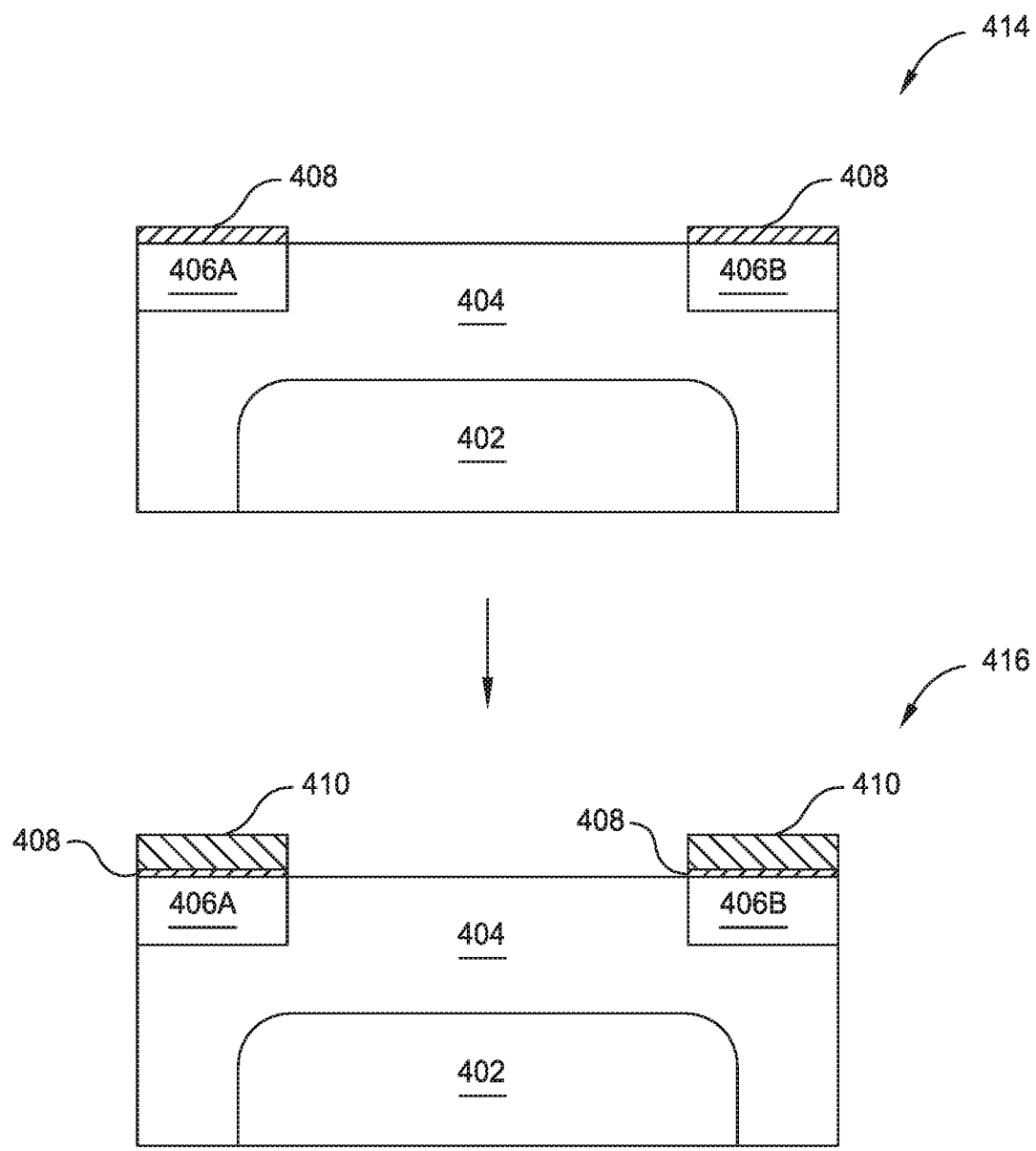
FIGS. 4A-4C are partial schematic illustrations of metal-silicide formation for MOSFET devices according to various embodiments of the present disclosure.
Figure 4B:
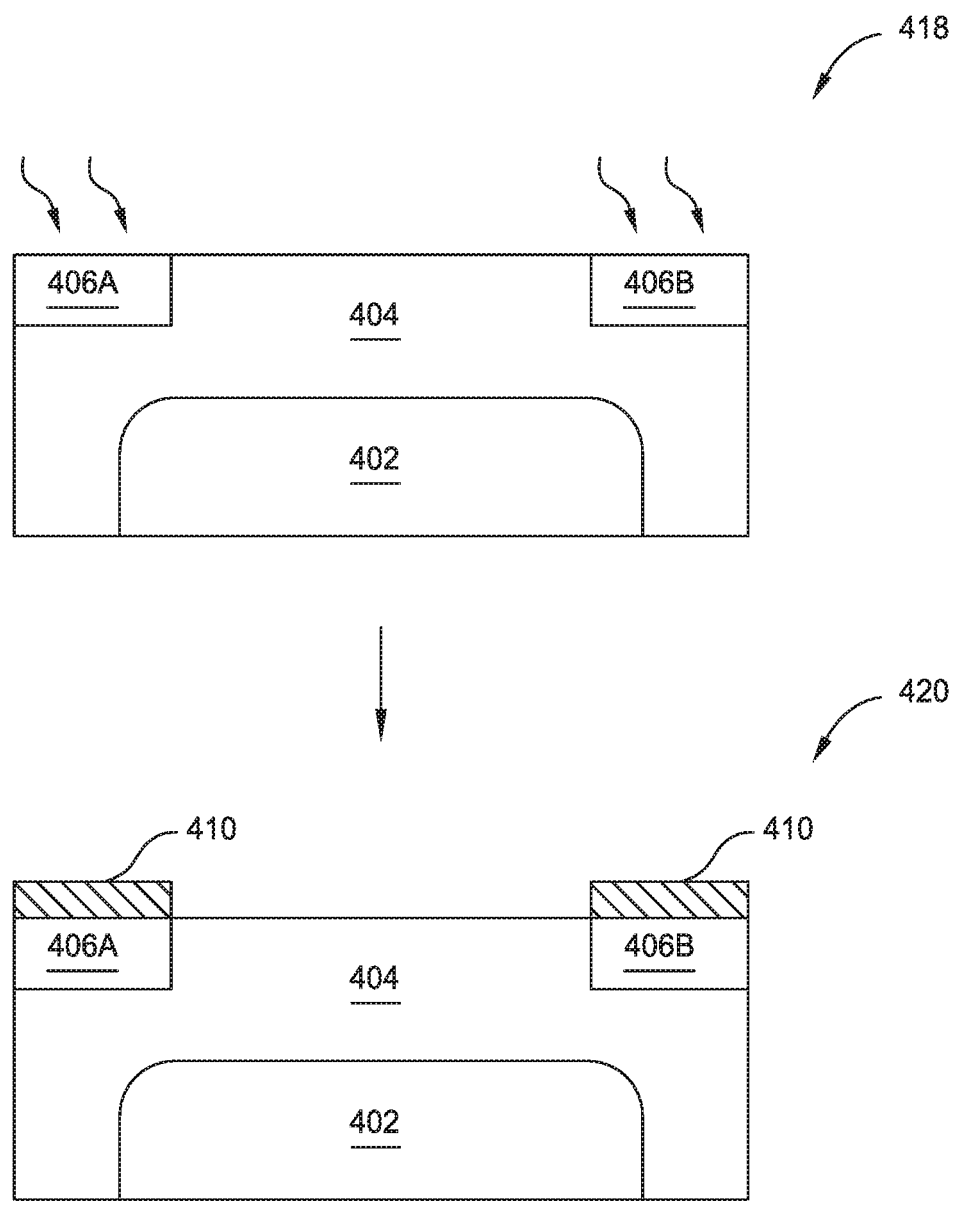
Figure 4C:
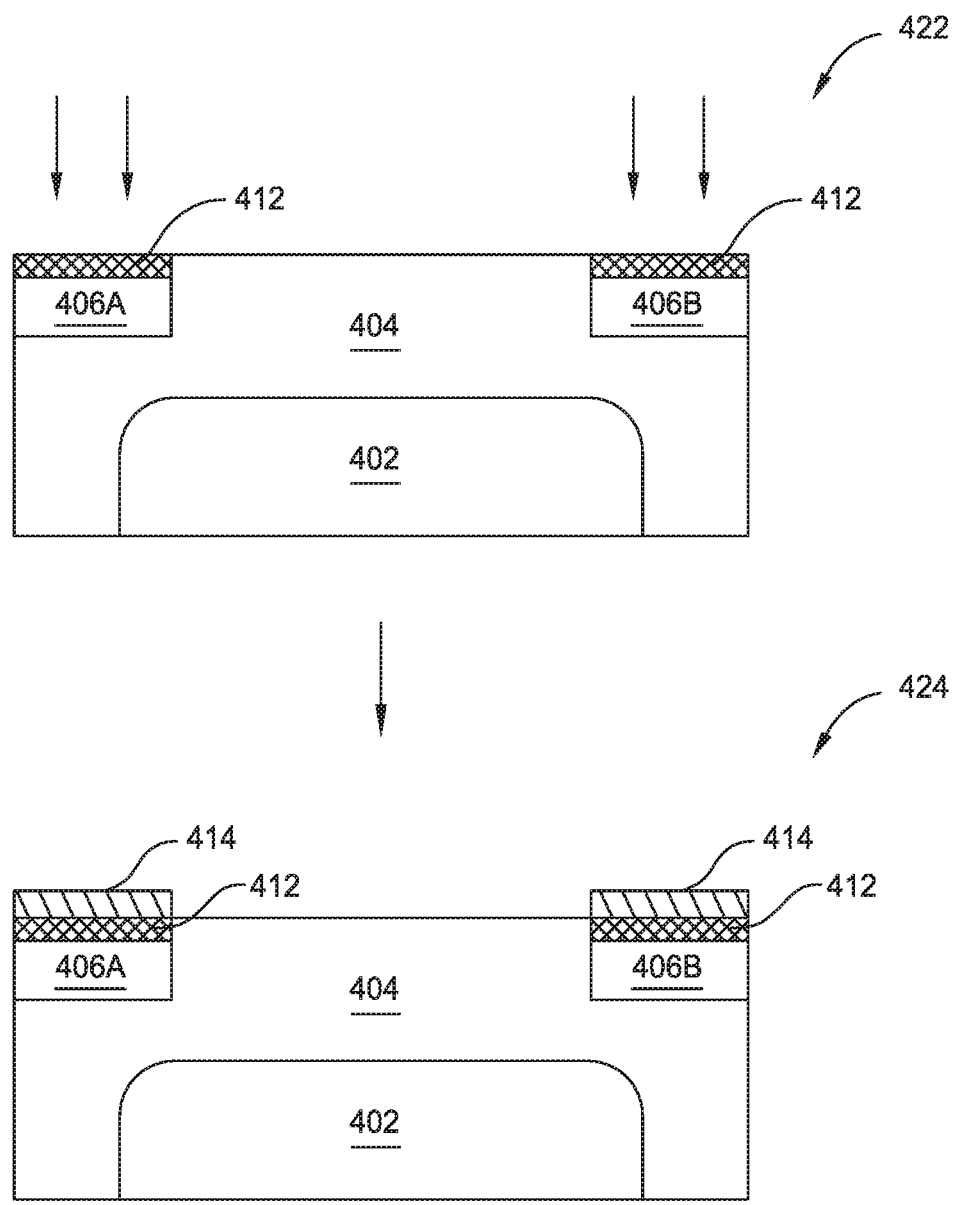

FIGS. 4A-4C are partial schematic illustrations of metal-silicide formation on a MOSFET device according to various embodiments of the present disclosure. The examples in FIGS. 4A-4C illustrate the formation of metal-silicides according to methods such as those discussed in FIGS. 2 and 3 above. The metal-silicide formation can thus occur at different points in the process as discussed with respect to FIG. 3.

FIG. 4A illustrates formation of a metal-silicide or poly metal-silicide after a pre-silicide treatment according to sub-operations 204A and/or 204B of FIG. 2 that are used to form a highly doped seed layer. A first structure 414 includes a substrate 402 having a channel 404 that can be a p-type channel or an n-type channel depending upon the device type (e.g., NMOS or PMOS). A highly doped seed layer 408 is formed on top of the source 406A and the drain 406B. The seed layer 408 can be formed according to embodiments of the present disclosure, such as the sub-operations 204A or 204B discussed above, depending upon whether the device is an NMOS or a PMOS device. The seed layer 408 reduces the activation energy of nucleation of a subsequently-formed metal-silicide because the dopant atoms act as nucleation sites for the metal-silicide layer. In this example, the seed layer 408 can be formed using a CVD process in the NMOS chamber that may be similar to the second chamber 104 of FIG. 1. The seed layer 408 can be formed to a thickness from 1 nm to 5 nm, and can include a dopant concentration from $1E^{19}$ to $1E^{23}$ as-formed.

Subsequent to the formation of the seed layer 408 on the first structure 414, a metal-silicide layer 410 is formed on the source 406A and the drain 406B. In an embodiment, the metal-silicide layer 410 is selectively formed on the source 406A and on the drain 406B. In the example in FIG. 4A, the seed layer 408 is still visible in the second structure 416, and a up to about 5% mass of either or both of the source 406A and the drain 406B may include the seed layer 408 In another example, not shown, the seed layer 408 is completely (100%) consumed by the metal-silicide layer 410.

FIG. 4B illustrates formation of a metal-silicide or poly metal-silicide after a pre-silicide treatment according to sub-operation 204C in FIG. 2. FIG. 4B illustrates a first structure 418 including a substrate 402, and a channel 404 that can be a p-type channel or an n-type channel depending upon the device type (e.g., NMOS or PMOS). FIG. 4B is an example of increasing the nucleation rate of metal-silicides by further doping the source 406A and the drain 406B using, for example, a soaking pre-silicide treatment such as that in the third sub-operation 204C discussed above. Subsequent to the soaking of the first structure 418, a second structure 420 is formed by the formation of the metal-silicide layer 410 on the source 406A and the drain 406B. The metal-silicide layer 410 selectively forms on the source 406A and the drain 406B and does not form on other areas of the structure 418 such as areas covered with dielectric material.

FIG. 4C illustrates formation of a metal-silicide or poly metal-silicide after a pre-silicide treatment to increase surface roughness of the substrate according to sub-operations 204D or 204E in FIG. 2. FIG. 4C illustrates a first structure 422 comprising a substrate 402 and a channel 404 that can be a p-type channel or an n-type channel depending upon the device type (e.g., NMOS or PMOS). The surface roughness can be increased to form the substrate surface 422 using pre-silicide treatments such as dopant implantation in the fourth sub-operations 204D and/or physical sputtering in the fifth sub-operation 204E in FIG. 2. Subsequently, a second structure 424 is formed by the deposition of a metal-silicide layer 414 on the source 406A and the drain 406B. The metal-silicide layer 414 is formed in a metal-silicide deposition chamber that may be similar to the first chamber 102 in FIG. 1.

The systems and methods discussed herein improve the nucleation of metal-silicides through the use of one or more pre-silicide treatments prior to the deposition of the metal-silicide. Nucleation of the metal-silicide during deposition can depend on a plurality of factors including the nucleation site density on the surface of the substrate and the activation energy barrier of nucleation of the metal-silicide. The pre-silicide treatment(s) improve the nucleation of the metal-silicide layer during deposition by decreasing the activation energy barrier for nucleation of the metal-silicide layer and/or by providing additional nucleation sites for the metal-silicide layer. The improved nucleation of the metal-silicide layer after one or more pre-silicide treatments can be in response to the one or more pre-silicide treatments increasing a dopant concentration of the substrate, as the dopant atoms can act as nucleation sites, or increasing a surface roughness of the substrate to provide a larger surface area for nucleation of the metal-silicide layer.

The lowered activation energy barrier further promotes the integrity of the substrate, e.g., the source and the drain, since the formation of the metal-silicide includes a reaction of the precursor or precursors with the substrate and consumes part of the substrate volume. When one or more pre-silicide treatments are used, the reaction that forms the metal-silicide consumes less of the source/drain volume as compared to conventional silicide formations that have not had one or more pre-silicide treatments discussed herein performed.

While the foregoing is directed to embodiments of the present disclosure, other and further embodiments of the disclosure may be devised without departing from the basic scope thereof, and the scope thereof is determined by the claims that follow.

What is claimed is:

1. A method of forming a metal-silicide, comprising:
   forming a seed layer on a substrate, wherein the seed layer comprises a doped silicon layer from 1 nm to 5 nm thick; and
   subsequently, forming, by CVD deposition, a metal-silicide layer on the seed layer, wherein forming the metal-silicide layer consumes a first portion of the seed layer, and wherein a second portion of the seed layer remains on the substrate after forming the metal-silicide layer.

2. The method of claim 1, wherein the seed layer comprises a dopant concentration from $1E^{19}$ atoms/cm$^3$ to $1E^{23}$ atoms/cm$^3$.

3. The method of claim 2, wherein the dopant within the seed layer comprises P, As, B, Ga, or Ge.

4. The method of claim 1, further comprising: prior to forming the seed layer on the substrate, performing a pre-cleaning operation on the substrate to remove oxides from the substrate.

5. The method of claim 1, wherein the seed layer is formed in a first process chamber and the metal-silicide layer is formed in a second process chamber.

6. The method of claim 5, further comprising transferring the substrate from the first process chamber subsequent to the forming of the seed layer to the second process chamber through a transfer chamber, wherein the substrate is not exposed to ambient air during the transferring.

7. A method of forming a metal-silicide, comprising:
   performing a pre-silicide treatment on a substrate, wherein the pre-silicide treatment comprises one or more of:
   forming a seed layer, wherein the seed layer is from 1 nm to 5 nm thick and comprises a dopant concentration from $1E^{19}$ atoms/cm$^3$ to $1E^{23}$ atoms/cm$^3$;
   exposing the substrate to one or more precursor sources to form a doped surface of the substrate;
   implanting a dopant in the substrate; and
   etching a surface of the substrate; and
   subsequent to performing the pre-silicide treatment on the substrate, forming, by CVD deposition, a metal-silicide layer on the treated substrate.

8. The method of claim 7, wherein the dopant within the seed layer comprises P, As, B, Ga, or Ge.

9. The method of claim 7, wherein the pre-silicide treatment is performed in an NMOS chamber, a PMOS chamber, a metal-silicide deposition chamber, or a plasma chamber.

10. The method of claim 9, wherein the pre-silicide treatment is performed in an NMOS chamber or a PMOS chamber, and wherein each of the NMOS and PMOS chambers is a source-drain epitaxy chamber.

11. The method of claim 9, wherein each of the NMOS chamber, the PMOS chamber, the metal-silicide deposition chamber, and the plasma chamber is coupled to a transfer chamber.

12. The method of claim 7, wherein the performing of the pre-silicide treatment occurs in a first process chamber and the forming of the metal-silicide layer occurs in a second process chamber.

13. The method of claim 12, further comprising: prior to performing the pre-silicide treatment, positioning the substrate in a pre-clean process chamber and performing a pre-cleaning operation.

* * * * *